United States Patent
Hwu et al.

(10) Patent No.: US 9,190,938 B2
(45) Date of Patent: Nov. 17, 2015

(54) PIEZOELECTRIC ACTUATING DEVICE

(71) Applicant: ACADEMIA SINICA, Taipei (TW)

(72) Inventors: En-Te Hwu, Taipei (TW); Ing-Shouh Hwang, Taipei (TW); Wei-Min Wang, Taipei (TW)

(73) Assignee: Academia Sinica, Taipei (TW)

( * ) Notice: Subject to any disclaimer, the term of this patent is extended or adjusted under 35 U.S.C. 154(b) by 369 days.

(21) Appl. No.: 13/784,068

(22) Filed: Mar. 4, 2013

(65) Prior Publication Data

US 2014/0077659 A1    Mar. 20, 2014

(30) Foreign Application Priority Data

Mar. 5, 2012  (TW) .............. 101107373 A

(51) Int. Cl.
*H01L 41/09* (2006.01)
*H02N 2/00* (2006.01)

(52) U.S. Cl.
CPC ............ *H02N 2/001* (2013.01); *H01L 41/0973* (2013.01); *H02N 2/0015* (2013.01); *H02N 2/0095* (2013.01)

(58) Field of Classification Search
USPC .................. 310/311, 328, 330–332
See application file for complete search history.

(56) References Cited

U.S. PATENT DOCUMENTS

| | | | | |
|---|---|---|---|---|
| 4,597,099 | A * | 6/1986 | Sawafuji ................ | 381/190 |
| 5,804,906 | A * | 9/1998 | Tsutsumi ................ | 310/322 |
| 7,635,941 | B2 * | 12/2009 | Bank et al. ............. | 310/328 |
| 8,520,869 | B2 * | 8/2013 | Fujise ..................... | 381/190 |
| 2012/0057730 | A1 * | 3/2012 | Fujise et al. ........... | 381/190 |
| 2013/0211630 | A1 * | 8/2013 | Storm et al. ........... | 701/3 |

FOREIGN PATENT DOCUMENTS

| | | |
|---|---|---|
| CN | 2580470 Y | 10/2003 |
| CN | 101336562 A | 12/2008 |
| CN | 201717838 U | 1/2011 |
| TW | 200637131 A | 10/2006 |
| TW | M353575 U | 3/2009 |

* cited by examiner

*Primary Examiner* — Thomas Dougherty
(74) *Attorney, Agent, or Firm* — Muncy, Geissler, Olds & Lowe, P.C.

(57) ABSTRACT

A piezoelectric actuating device includes a carrier, at least a piezoelectric unit, at least a linked component and a moving component. The piezoelectric unit is disposed on the carrier and includes at least a piezoelectric buzzer. The linked component is disposed corresponding to the piezoelectric unit. One end of the linked component is attached to the piezoelectric buzzer. The moving component is connected with the linked component. When the piezoelectric buzzer is actuated, it can carry the linked component to move correspondingly so as to move the moving component. The piezoelectric actuating device has the advantage of low cost and can achieve the sub-nanometer scale actuating resolution.

11 Claims, 12 Drawing Sheets

PIEZOELECTRIC ACTUATING DEVICE

CROSS REFERENCE TO RELATED APPLICATIONS

This Non-provisional application claims priority under 35 U.S.C. §119(a) on Patent Application No(s). 101107373 filed in Taiwan, Republic of China on Mar. 5, 2012, the entire contents of which are hereby incorporated by reference.

BACKGROUND OF THE INVENTION

1. Field of Invention

The present invention relates to an actuating device and, in particular, to a piezoelectric actuating device.

2. Related Art

The nanometer-scaled precise position is a very important technology in the nanometer technical researches. It can be widely applied to various applications such as the scanning probe microscopy (SPM), atomic force microscopy (AFM), scanning electron microscope (SEM), actuating stage for micro probe or micro tube, optical path structure with nanometer-scaled resolution, micro robot arm with nanometer-scaled resolution, or optical system stage.

Regarding to an atomic force microscope, the actuating stage thereof includes a piezoelectric tube actuator for achieving the desired nanometer-scaled resolution. However, the piezoelectric tube actuator is very expensive. Except for some large and rich labs, most colleges, schools, researchers, and labs can not afford it, so these units can only try to rent the expensive equipment for their researches and teachings.

Therefore, it is an important subject to provide a piezoelectric actuating device having the advantage of low cost and capable of achieving the sub-nanometer scale actuating resolution.

SUMMARY OF THE INVENTION

In view of the foregoing subject, an objective of the present invention is to provide a piezoelectric actuating device having the advantage of low cost and capable of achieving the sub-nanometer scale actuating resolution.

To achieve the above objective, the present invention discloses a piezoelectric actuating device including a carrier, at least a piezoelectric unit, at least a linked component and a moving component. The piezoelectric unit is disposed on the carrier and includes at least a piezoelectric buzzer. The linked component is disposed corresponding to the piezoelectric unit. One end of the linked component is attached to the piezoelectric buzzer. The moving component is connected with the linked component. When the piezoelectric buzzer is actuated, it can carry the linked component to move correspondingly so as to move the moving component.

In one embodiment, the piezoelectric actuating device comprises a plurality of piezoelectric units disposed at opposite sides of the carrier.

In one embodiment, the piezoelectric actuating device comprises a plurality of piezoelectric units disposed at the same side of the carrier.

In one embodiment, the piezoelectric buzzer comprises a piezoelectric ceramic element disposed on a supporting plate.

In one embodiment, the piezoelectric ceramic element is adhered on the supporting plate.

In one embodiment, the supporting plate is made of stainless steel, copper, aluminum, nickel, carbon fiber, or conductive ceramic.

In one embodiment, the area of the piezoelectric ceramic element is smaller than or equal to that of the supporting plate.

In one embodiment, the piezoelectric unit comprises a plurality of piezoelectric buzzers overlapped with each other.

In one embodiment, the linked component comprises a screw, a screw rod, or a linked rod.

In one embodiment, the piezoelectric actuating device further comprises a casing, and the carrier is disposed on the casing.

In one embodiment, the piezoelectric actuating device is a fine positioning stage.

In one embodiment, the piezoelectric actuating device is applied to a scan probe microscope, an electron microscope, a nanometer-scaled actuating stage for a micro probe or a micro tube, an optical path structure with nanometer-scaled resolution, a micro robot arm with nanometer-scaled resolution, or an optical system stage.

As mentioned above, the piezoelectric actuating device includes a carrier, at least a piezoelectric unit, at least a linked component and a moving component, and the piezoelectric unit includes at least a piezoelectric buzzer. When the piezoelectric buzzer is actuated, it can carry the linked component to move correspondingly so as to move the moving component. Accordingly, the piezoelectric actuating device of the present invention has the advantage of low cost and is capable of achieving the sub-nanometer scale actuating resolution. Moreover, since the piezoelectric buzzer functions as the actuating component of the piezoelectric actuating device, the piezoelectric actuating device further has the advantage of low driving voltage. This can protect the users even if the users touch the piezoelectric actuating device.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
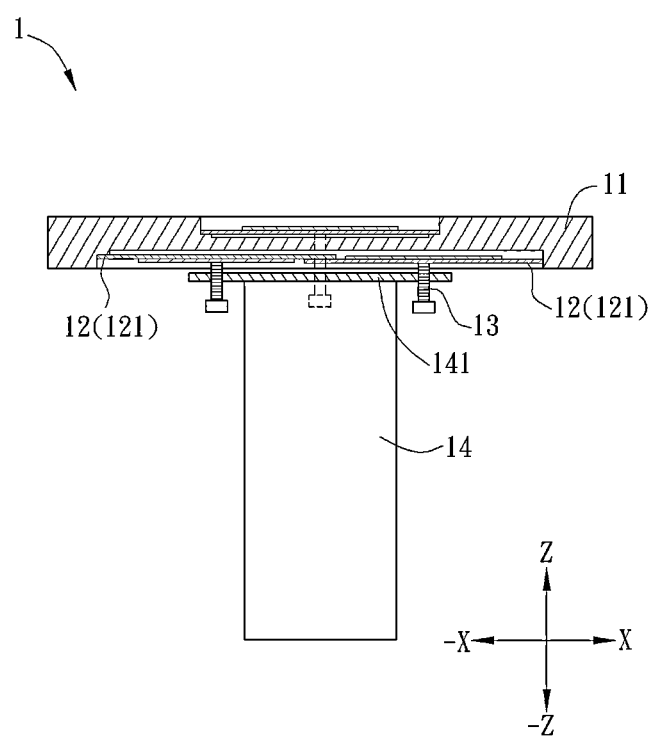
FIG. 1 is a sectional view of a piezoelectric actuating device according to an embodiment of the invention.

FIG. 1 is a sectional view of a piezoelectric actuating device 1 according to an embodiment of the invention. The piezoelectric actuating device 1 is, for example, a fine positioning stage for positioning or adjusting an optical element (e.g. an optical head) or a sample in nanometer scale. The piezoelectric actuating device 1 can be applied to, for example but not limited to, a scan probe microscope, an electron microscope, a nanometer-scaled actuating stage for a micro probe or a micro tube, an optical path structure with nanometer-scaled resolution, a micro robot arm with nanometer-scaled resolution, or an optical system stage.

The piezoelectric actuating device 1 includes a carrier 11, at least a piezoelectric unit 12, at least a linked component 13, and a moving component 14.

The carrier 11 can be a platform or a casing on which the piezoelectric unit 12 is fixed. In this case, the carrier 11 is a platform and the piezoelectric unit 12 is disposed on the platform.

Figure 2A:
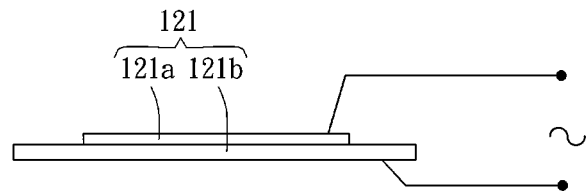
FIG. 2A is a schematic diagram of a piezoelectric buzzer.
Figure 2B:
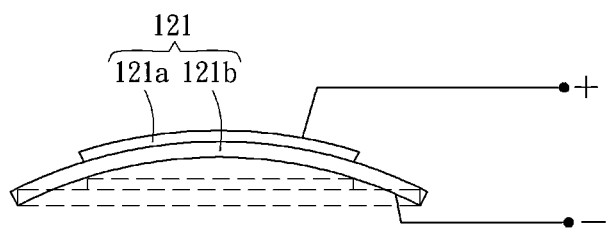
FIGS. 2B and 2C are schematic diagrams showing the piezoelectric buzzer in different operations.
Figure 2C:
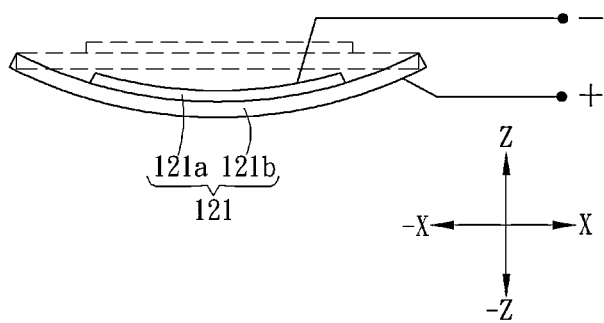

The piezoelectric unit 12 includes at least a piezoelectric buzzer 121. Referring to FIG. 2A, the piezoelectric buzzer 121 includes a piezoelectric ceramic element 121a disposed on a supporting plate 121b. In general, the piezoelectric ceramic element 121a is made by polarizing a piezoelectric ceramic material with high voltage and then printing to form a thin plate. The thickness of the piezoelectric ceramic element 121a is approximately 0.2 mm or thinner. The area of the piezoelectric ceramic element 121a can be smaller than or equal to that of the supporting plate 121b, and the piezoelectric ceramic element 121a can be attached on the supporting plate 121b by silver paste (not shown). In this embodiment, the area of the piezoelectric ceramic element 121a is smaller than that of the supporting plate 121b. When an AC voltage is applied to the piezoelectric buzzer 121, the converse piezoelectric effect of the piezoelectric ceramic element 121a can cause the mechanical deformation of the supporting plate 121b. As shown in FIGS. 2B and 2C, the piezoelectric buzzer 121 can be bended upwardly or downwardly by the driving voltages of different polarities, so that the center portion of the piezoelectric buzzer 121 has a displacement parallel to the direction. This characteristic allows the supporting plate 121b to generate vibration or sound, so that it can be used as a vibration component or a speaker for an electronic apparatus.

The supporting plate 121b can be made of a conductive material such as, for example but not limited to, stainless steel, copper, aluminum, nickel, carbon fiber, or conductive ceramic. When the material of the supporting plate 121b has smaller compression ratio and higher rigidity (e.g. metal, alloy, carbon fiber or ceramic material), the available displacement of the center portion of the supporting plate 121b is smaller. Nevertheless, the supporting plate 121b with smaller compression ratio and higher rigidity is suitable for high-frequency applications such as the scan probe of scan atomic force microscope.

Figure 2D:
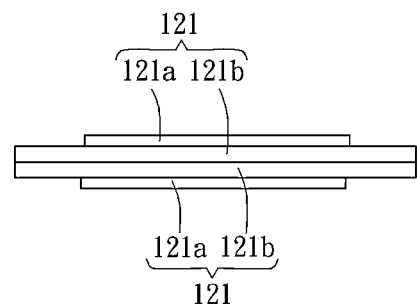
FIGS. 2D to 2F are schematic diagrams showing different combinations of multiple piezoelectric buzzers.
Figure 2E:
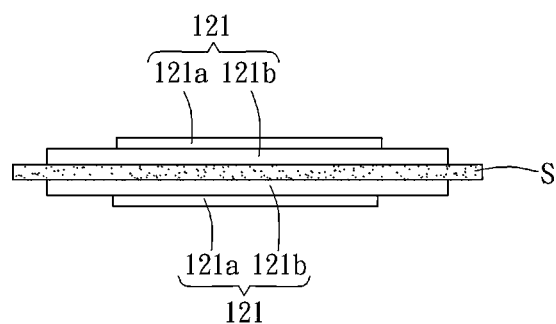

In another embodiment, when the piezoelectric unit 12 is configured with a plurality of piezoelectric buzzers 121, the piezoelectric buzzers 121 can be overlapped. Referring to FIG. 2D, two piezoelectric buzzers 121 are stacked reversely, which means the back sides of the two piezoelectric buzzers 121 are connected. Accordingly, the stacked piezoelectric buzzers 121 can provide a larger structural rigidity. Referring to FIG. 2E, a spacer S with higher rigidity is sandwiched between two piezoelectric buzzers 121 so as to minimize the displacement of the center portion of the piezoelectric buzzers 121. In this case, the spacer S with higher rigidity can increase the entire rigidity of the piezoelectric unit 12, so the piezoelectric unit 12 is suitable for high-frequency applications with higher frequently displacements. For example, it can be applied to the scan probe of a scan atomic force microscope.

Figure 2F:
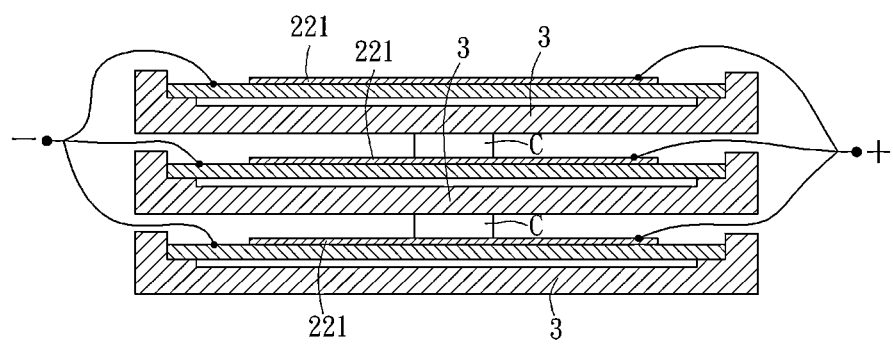

In another embodiment, as shown in FIG. 2F, a piezoelectric buzzer 221 is disposed within a carrier 3 and a connecting component C is configured to connect two sets of the piezoelectric buzzer 221 and carrier 3 in series so as to provide a large actuated displacement. In this case, two connecting components C are configured to connect three sets of the piezoelectric buzzer 221 and carrier 3 in series. When the three piezoelectric buzzers 221 are electrically connected and applied with the same voltage, the piezoelectric buzzers 221 can individually gain a displacement so as to obtain a triple displacement by the three sets of the piezoelectric buzzers 221 and carriers 3. This configuration can significantly increase the actuated output with larger displacement.

Figure 3A:
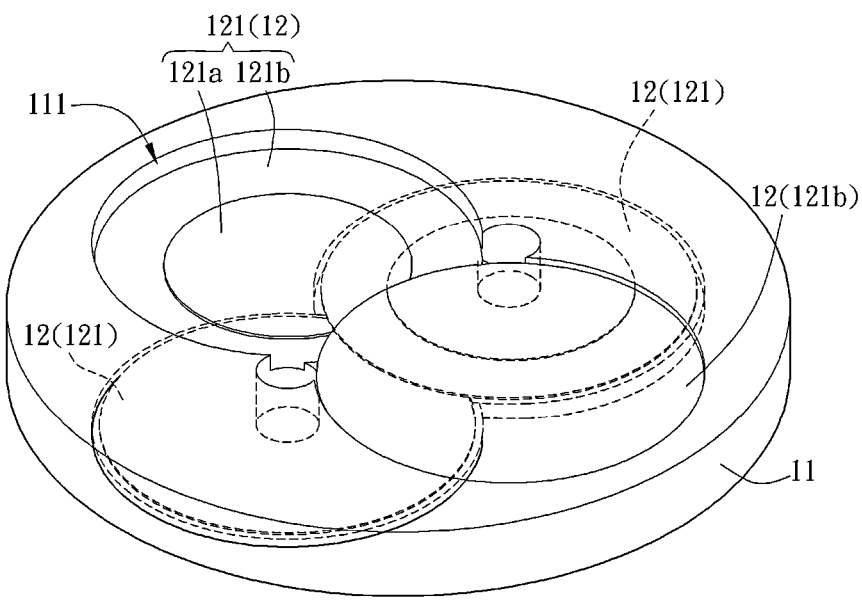
FIG. 3A is a schematic diagram showing the carrier and piezoelectric unit of the piezoelectric actuating device of FIG. 1.

FIG. 3A is a schematic diagram showing the carrier 11 and piezoelectric unit 12 of the piezoelectric actuating device 1 of FIG. 1. Herein, FIG. 3A is a bottom view of FIG. 1 and only shows the carrier 11 and piezoelectric unit 12 of FIG. 1.

Referring to FIGS. 1 and 3A, the present embodiment includes four piezoelectric units 12, wherein two piezoelectric units 12 are embedded into the corresponding recesses 111 at one side of the carrier 11, while the residual two piezoelectric units 12 are embedded into the corresponding recesses 111 at the opposite side of the carrier 11. Each piezoelectric unit 12 includes a piezoelectric buzzer 121. Regarding to two piezoelectric buzzers 121 located at the same side, one of them has a piezoelectric ceramic element 121a facing upwardly, and the other one has a piezoelectric ceramic element 121a facing downwardly (the supporting plate 121b faces upwardly).

Figure 3B:
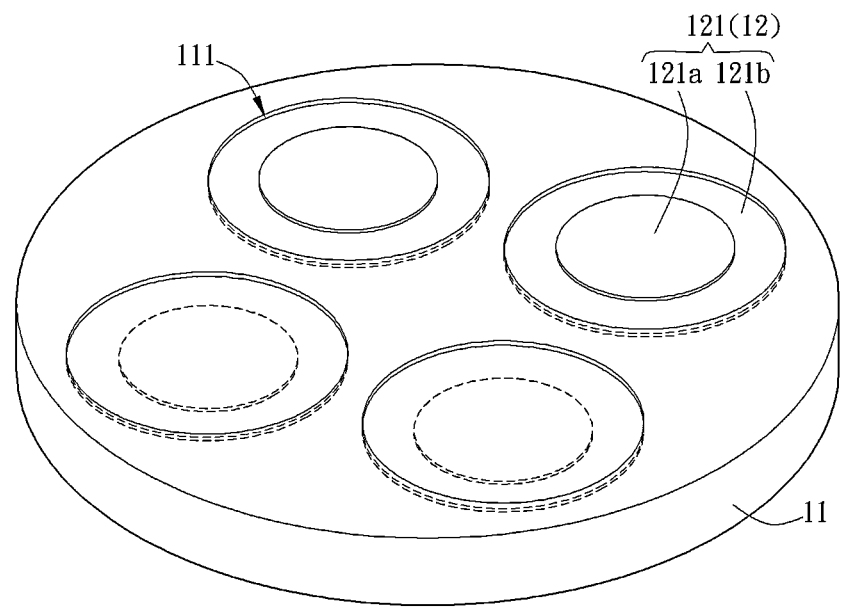
FIG. 3B is a schematic diagram showing the carrier and piezoelectric unit of another piezoelectric actuating device.

When the area of the carrier 11 is larger or the area of the piezoelectric units 12 (or the piezoelectric buzzers 121) is smaller, the piezoelectric units 12 may be all embedded into the corresponding recesses 111 at the same side of the carrier 11 (see FIG. 3B). In this case, two of the piezoelectric ceramic elements 121a face upwardly, and the other two piezoelectric ceramic elements 121a face downwardly. Otherwise, the four piezoelectric ceramic elements 121a may all face upwardly or have different configurations, and this invention is not limited.

Referring to FIG. 1 again, the linked component 13 is disposed opposite to the piezoelectric unit 12, and one end of the linked component 13 is attached to the piezoelectric unit 12. In this embodiment, four linked components 13 are configured corresponding to four piezoelectric units 12. In addition, the one end of the linked component 13 may be attached to the piezoelectric buzzer 121 and connected with the moving component 14. When the piezoelectric buzzer 121 is actuated, it can carry the linked component 13 to move correspondingly so as to move the moving component 14.

Figure 4:
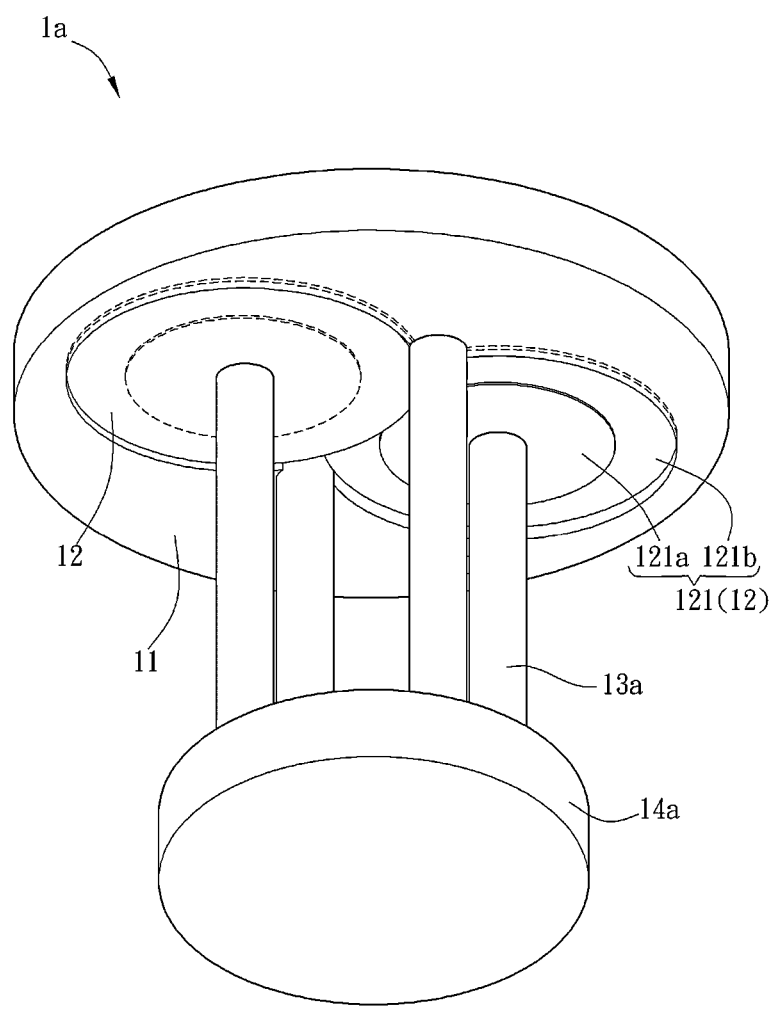
FIG. 4 is a schematic diagram of a piezoelectric actuating device according to another embodiment of the invention.

In this embodiment, the linked component 13 is a screw, and the moving component 14 has a long shape or a tube shape. One end of the screw is attached to the piezoelectric buzzer 121, while the other end thereof penetrates through a top surface 141 of the moving component 14 and then connects with the moving component 14. The horizontal level of the moving component 14 can be properly adjusted by the screw and the moving component 14 is linked and moved. In another embodiment, the linked component 13 can be a screw rod or a linked rod, and the moving component 14 can be a rod or a platform. FIG. 4 is a schematic diagram of a piezoelectric actuating device 1a according to another embodiment of the invention. In this embodiment, the linked component 13a is a linked rod, and the moving component 14a is a platform.

Besides, two ends of the linked component 13a are connected to the piezoelectric unit 12 and the moving component 14a, respectively.

Figure 5A:
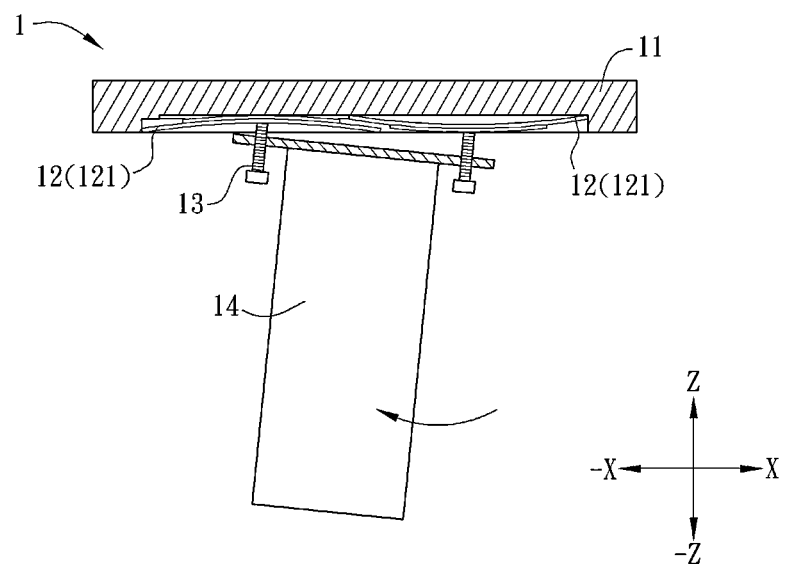
FIGS. 5A and 5B are schematic diagrams showing the piezoelectric actuating device in operation.
Figure 5B:
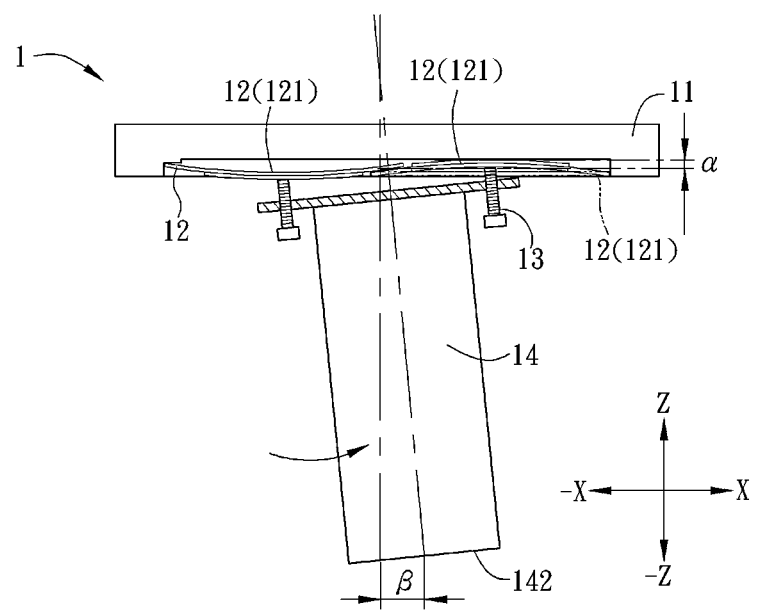

FIGS. 5A and 5B are schematic diagrams showing the piezoelectric actuating device 1 in operation.

FIGS. 5A and 5B only show two piezoelectric units 12 (piezoelectric buzzers 121) and two linked components 13 at one side of the carrier 11 (top side), and the residual piezoelectric units 12 (piezoelectric buzzers 121) and linked components 13 are not shown.

With reference to FIG. 5A, a proper voltage is supplied to two piezoelectric buzzers 121, one of which (left one) is bended upwardly while the other one (right one) is bended downwardly. According to the deformations of the two piezoelectric buzzers 121, two linked components 13 are relatively pushed so as to carry two moving components 14 to move leftwards. Thus, the two moving components 14 can generate a displacement along the direction −X.

Referring to FIG. 5B, a proper voltage is supplied to two piezoelectric buzzers 121, one of which (left one) is bended downwardly while the other one (right one) is bended upwardly. According to the deformations of the two piezoelectric buzzers 121, two linked components 13 are relatively pushed so as to carry two moving components 14 to move rightwards. Thus, the two moving components 14 can generate a displacement along the direction X. Similarly, it is also possible to supply a proper voltage to the other two piezoelectric units 12 disposed at the other side (top side) of the carrier 11, thereby controlling the displacement of the moving components 14 along the directions −Y and Y (not shown). Alternatively, it is also possible to supply a proper voltage to any combination of the four piezoelectric units 12 (or piezoelectric buzzers 121) to control the displacement of the corresponding moving components 14 on the X-Y plane or along the direction Z.

Besides, as shown in FIG. 5B, although the deformation displacement α of the upwardly bended piezoelectric buzzers 121 is very small, the configuration of the moving components 14 can generate a rightward displacement 13 that is much greater than the displacement α. Accordingly, the travel distance of an object disposed at one end 142 of the moving component 14 can be properly enlarged.

Figure 6:
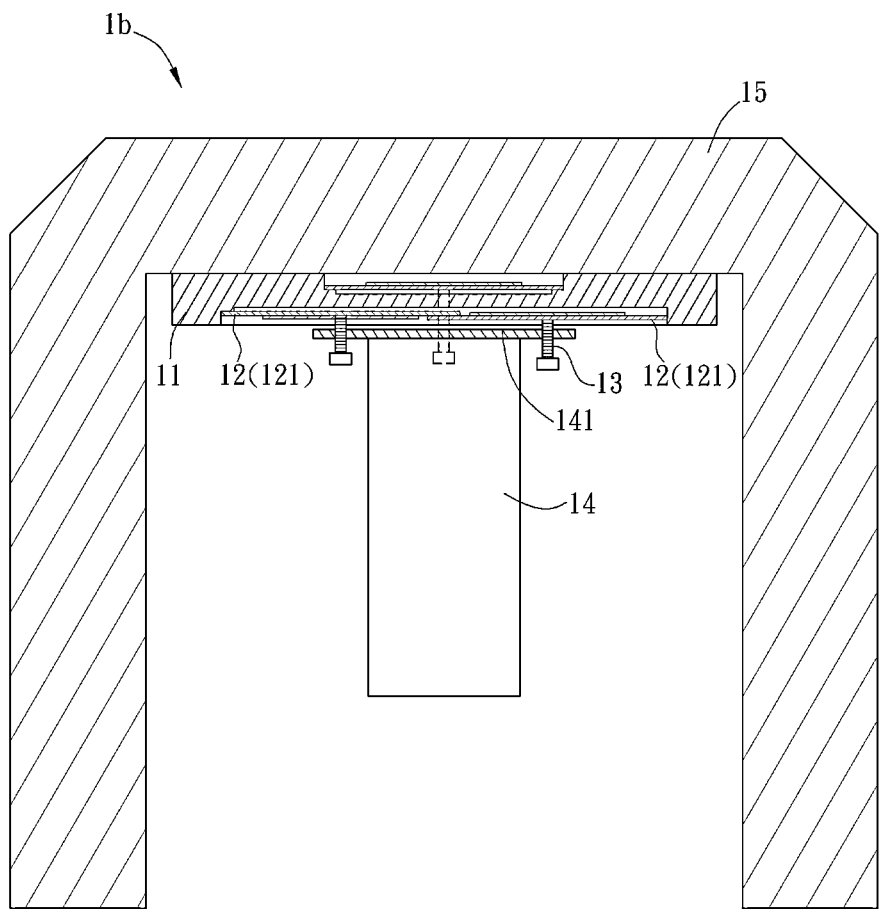
FIG. 6 is a sectional view of a piezoelectric actuating device of another aspect.

FIG. 6 is a sectional view of a piezoelectric actuating device 1b of another aspect.

Different from the piezoelectric actuating device 1, as shown in FIG. 6, the piezoelectric actuating device 1b further includes a casing 15, and the carrier 11, the piezoelectric unit 12, the linked component 13 and the moving component 14 are all disposed in the casing 15. The configuration of the casing 15 can support and protect the carrier 11, the piezoelectric unit 12, the linked component 13 and the moving component 14 therein. Of course, the carrier 11 and the casing 15 can be integrally formed as one piece, so that the piezoelectric unit 12 is directly disposed on the casing 15.

Figure 7A:
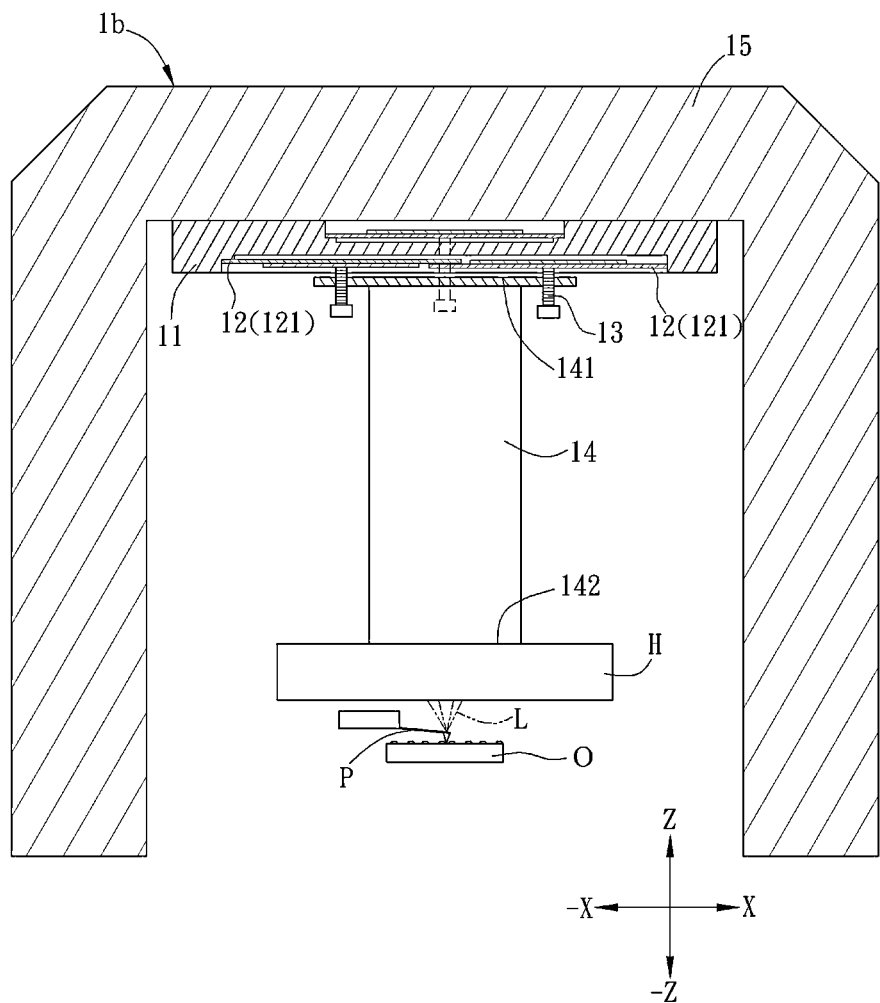
FIGS. 7A and 7B are sectional views of the piezoelectric actuating device in different applications.

FIG. 7A is a sectional view of the piezoelectric actuating device 1b applied to an atomic force microscope.

In this case, the piezoelectric actuating device 1b is used as a nanometer-scaled fin positioning stage of an atomic force microscope. As shown in FIG. 7A, an optical element H (e.g. an optical head) is disposed at one end 142 of the moving component 14 of the piezoelectric actuating device 1b. The optical element H can emit a light beam L (e.g. a laser) to irradiate a scan probe P, so that the scan probe P can detect the surface structure of an object O. After the light beam L irradiates the scan probe P, the light beam L is reflected and received by an optical sensor (not shown) so as to control the movement of the moving component 14 of the piezoelectric actuating device 1b. Moreover, a certain interaction between the probe tip of the scan probe P and the surface of the object O is maintained at a proper value. The optical sensor receives the adjusting information, which is the interaction information between the scan probe P and the object O, for controlling the position of the moving component 14 of the piezoelectric actuating device 1b. The received adjusting information also indicates the surface structure information of the object O, so that the surface structure information of the object O can be obtained by the optical sensor.

Figure 7B:
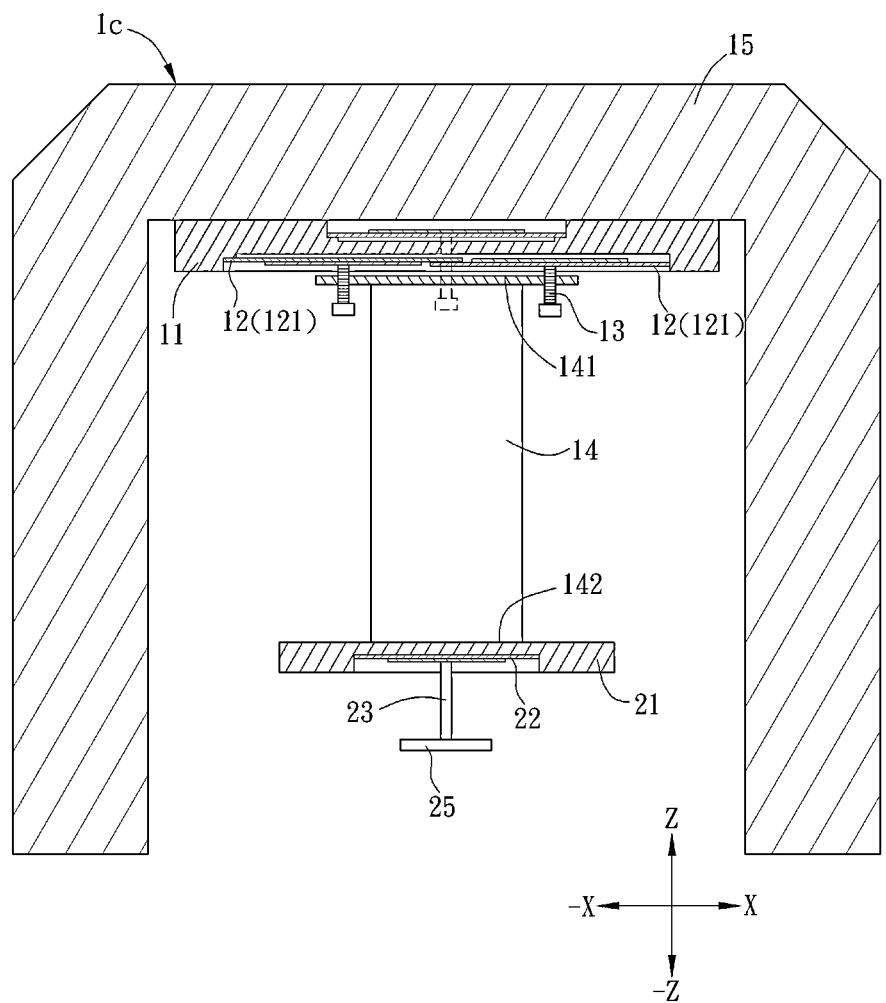

FIG. 7B is a sectional view of the piezoelectric actuating device 1c in another application.

In this case, the piezoelectric actuating device 1c is also used as a nanometer-scaled fin positioning stage of a sample. As shown in FIG. 7B, another carrier 21 is disposed at one end 142 of the moving component 14 of the piezoelectric actuating device 1c, and another piezoelectric unit 22 is disposed on the carrier 21. Moreover, a corresponding linked component 23 and a sample platform 25 connected to the linked component 23 are also provided. The sample platform 25 can support a sample (not shown), so that the piezoelectric actuating device 1c can be used as a nanometer-scaled fin positioning stage. After supplying a proper voltage, the piezoelectric unit 22 can be bended upwardly or downwardly, so that the sample on the sample platform 25 can generate a displacement along the direction Z.

Figure 8A:
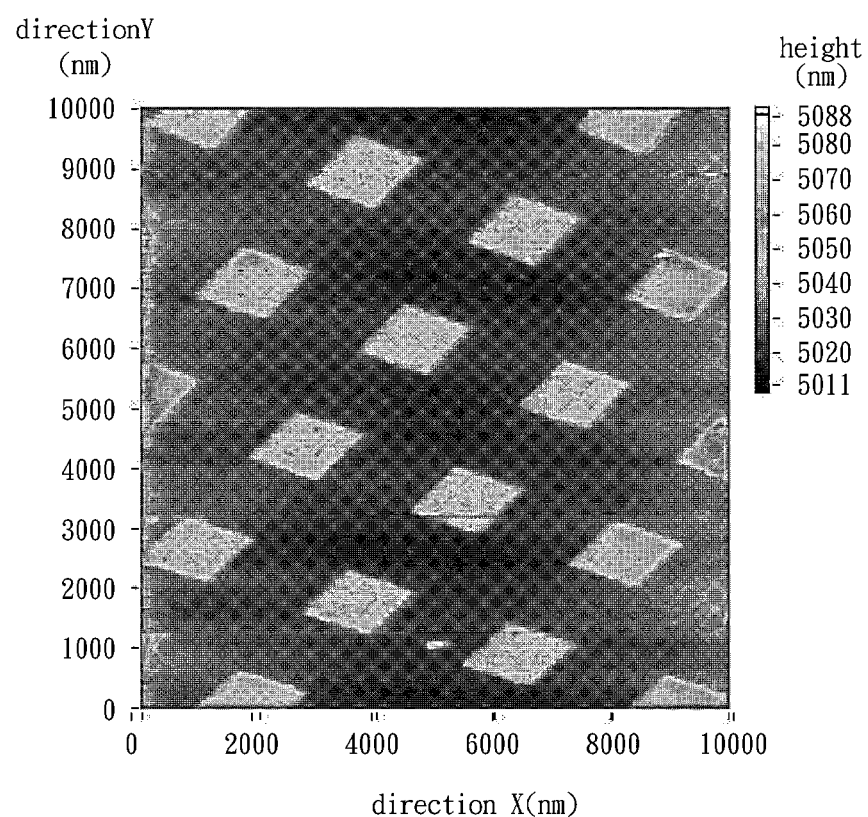
FIGS. 8A and 8B are schematic photos showing the scan results of an atomic force microscope applied with the piezoelectric actuating device of the present invention.
Figure 8B:
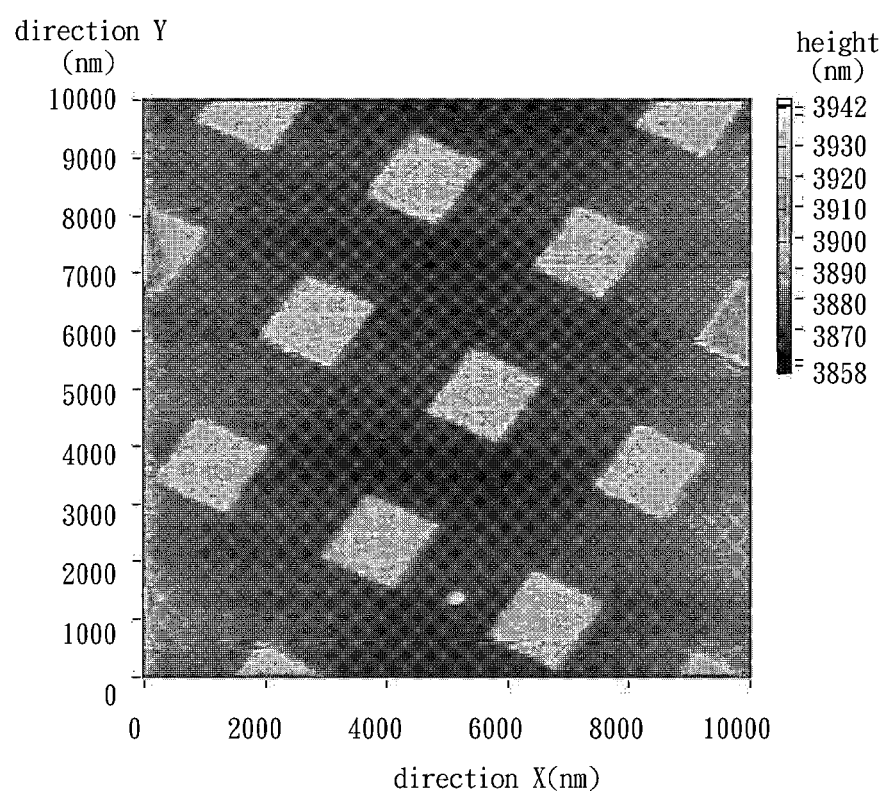

FIGS. 8A and 8B are schematic photos showing the scan results of an atomic force microscope applied with the piezoelectric actuating device 1b of the present invention.

The piezoelectric actuating device 1b of the invention employs the common and cheap piezoelectric buzzer 121 as the actuating element, so it still has the delay and non-linear characteristics. To compensate the undesired characteristics, it is possible to change the voltage for driving the piezoelectric buzzer 121 for calibrating it.

FIGS. 8A and 8B show the scan results of an atomic force microscope applied (see FIG. 7A) before and after the calibration. The sample has a square bump with a height of 20 nm and a plurality of internal bumps with a height of 1-2 nm. According to the scan photos of FIGS. 8A and 8B, the piezoelectric actuating device 1b applied to the atomic force microscope can provide an excellent stability so as to achieve the nanometer-scaled scan resolution. In addition, the scan range of FIG. 8A is about 10.9 μm, and the ratio of the unit lengths in the directions X and Y is about 1:0.7. Thus, the scanned squares shown in FIG. 8A seem like rhombuses. After a proper calibration of the driving voltages by, for example, adjusting the voltages for driving the displacements in the directions X and Y, the scan ratio in the directions X and Y becomes approximate 1:1, thereby obtaining the sharper squares as shown in FIG. 8B.

Furthermore, since the piezoelectric actuating device 1b also uses the piezoelectric buzzer 121 as the actuating element, the displacement of 10 μm can be provided by supplying the voltage of approximate ±10V. Compared with the conventional piezoelectric actuator, which usually needs a voltage over 150V for achieving the above displacement, the required driving voltage of the invention is relatively much lower. This is also much safer for the user.

In summary, the piezoelectric actuating device includes a carrier, at least a piezoelectric unit, at least a linked component and a moving component, and the piezoelectric unit includes at least a piezoelectric buzzer. When the piezoelectric buzzer is actuated, it can carry the linked component to move correspondingly so as to move the moving component. Accordingly, the piezoelectric actuating device of the present invention has the advantage of low cost and is capable of achieving the sub-nanometer scale actuating resolution. Moreover, since the piezoelectric buzzer functions as the actuating component of the piezoelectric actuating device, the piezoelectric actuating device further has the advantage of low driving voltage. This can protect the users even if the users touch the piezoelectric actuating device.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A piezoelectric actuating device, comprising:
   a carrier;
   a first piezoelectric unit disposed on the carrier and comprising a first piezoelectric buzzer;
   a second piezoelectric unit disposed on the carrier and comprising a second piezoelectric buzzer, wherein the second piezoelectric unit is directly connected to the first piezoelectric unit;
   a first linked component disposed corresponding to the first piezoelectric unit, wherein one end of the first linked component is attached to the first piezoelectric buzzer;
   a second linked component disposed corresponding to the second piezoelectric unit, wherein one end of the second linked component is attached to the second piezoelectric buzzer; and
   a moving component connected with the first linked component and the second linked component;
   wherein, when one of the first piezoelectric buzzer and the second piezoelectric unit is actuated, it carries the first linked component and the second linked component to move correspondingly so as to move the moving component.

2. The piezoelectric actuating device of claim 1, wherein the first piezoelectric unit and the second piezoelectric unit are disposed at opposite sides of the carrier.

3. The piezoelectric actuating device of claim 1, wherein the first piezoelectric unit and the second piezoelectric unit are disposed at the same side of the carrier.

4. The piezoelectric actuating device of claim 1, wherein each of the first piezoelectric buzzer and the second piezoelectric buzzer comprises a piezoelectric ceramic element disposed on a supporting plate.

5. The piezoelectric actuating device of claim 4, wherein the piezoelectric ceramic element is adhered on the supporting plate.

6. The piezoelectric actuating device of claim 4, wherein the supporting plate is made of stainless steel, copper, aluminum, nickel, carbon fiber, or conductive ceramic.

7. The piezoelectric actuating device of claim 4, wherein the area of the piezoelectric ceramic element is smaller than or equal to that of the supporting plate.

8. The piezoelectric actuating device of claim 1, wherein each of the first linked component and the second linked component comprises a screw, a screw rod, or a linked rod.

9. The piezoelectric actuating device of claim 1, further comprising:
   a casing, wherein the carrier is disposed on the casing.

10. The piezoelectric actuating device of claim 1, wherein the piezoelectric actuating device is a fine positioning stage.

11. The piezoelectric actuating device of claim 1, applied to a scan probe microscope, an electron microscope, a nanometer-scaled actuating stage for a micro probe or a micro tube, an optical path structure with nanometer-scaled resolution, a micro robot arm with nanometer-scaled resolution, or an optical system stage.

* * * * *